United States Patent
Buckle et al.

(10) Patent No.: US 7,892,879 B2
(45) Date of Patent: Feb. 22, 2011

(54) MANUFACTURE OF CADMIUM MERCURY TELLURIDE ON PATTERNED SILICON

(75) Inventors: Louise Buckle, Malvern (GB); John W Cairns, Malvern (GB); Jean Giess, Malvern (GB); Neil T Gordon, Malvern (GB); Andrew Graham, Malvern (GB); Janet E Hails, Malvern (GB); David J Hall, Malvern (GB); Colin J Hollier, Malvern (GB); Graham J Pryce, Malvern (GB); Andrew J Wright, Malvern (GB)

(73) Assignee: Qinetiq Limited, London (GB)

( * ) Notice: Subject to any disclaimer, the term of this patent is extended or adjusted under 35 U.S.C. 154(b) by 973 days.

(21) Appl. No.: 11/628,871

(22) PCT Filed: Aug. 1, 2005

(86) PCT No.: PCT/GB2005/003015

§ 371 (c)(1),
(2), (4) Date: Dec. 8, 2006

(87) PCT Pub. No.: WO2006/013344

PCT Pub. Date: Feb. 9, 2006

(65) Prior Publication Data

US 2007/0235653 A1      Oct. 11, 2007

(30) Foreign Application Priority Data

Aug. 2, 2004   (GB) .................................. 0417471.0
Jan. 27, 2005  (GB) .................................. 0501676.1

(51) Int. Cl.
*H01L 29/22* (2006.01)

(52) U.S. Cl. ........................... 438/94; 438/47; 257/188; 257/200; 257/614; 257/627; 257/E31.005

(58) Field of Classification Search .................... 438/94
See application file for complete search history.

(56) References Cited

U.S. PATENT DOCUMENTS 4,566,918 A    1/1986 Irvine et al.

(Continued)

FOREIGN PATENT DOCUMENTS

EP         0 343 738 A     11/1989

(Continued)

OTHER PUBLICATIONS de Lyon et al, "MBE growth of HgCdTe on silicon substrates for large-area infrared focal plane arrays: A review of recent progress", J. Electronic Materials 28(6) 1999 pp. 705-711.

(Continued)

*Primary Examiner*—Jerome Jackson, Jr.
(74) *Attorney, Agent, or Firm*—Nixon & Vanderhye P.C.

(57) ABSTRACT

This invention relates to the manufacture of Cadmium Mercury Telluride (CMT) on patterned silicon, especially to growth of CMT on silicon substrates bearing integrated circuitry. The method of the invention involves growing CMT in selected growth windows on the silicon substrate by first growing one or more buffer layers by MBE and then growing the CMT by MOVPE. The growth windows may be defined by masking the area outside of the growth windows. Growth within the growth windows is crystalline whereas any growth outside the growth windows is polycrystalline and can be removed by etching. The invention offers a method of growing CMT structures directly on integrated circuits removing the need for hybridisation.

25 Claims, 4 Drawing Sheets

U.S. PATENT DOCUMENTS

| | | | |
|---|---|---|---|
| 4,650,539 A | | 3/1987 | Irvine et al. |
| 4,950,621 A | | 8/1990 | Irvine et al. |
| 4,965,649 A | | 10/1990 | Zanio et al. |
| 4,970,567 A | | 11/1990 | Ahlgren |
| 5,192,695 A | | 3/1993 | Wang et al. |
| 5,290,394 A | | 3/1994 | Sasaki |
| 5,380,669 A | | 1/1995 | Norton |
| 5,608,208 A | | 3/1997 | Nemirovsky |
| 5,759,266 A | | 6/1998 | Kawano |
| 5,838,053 A | * | 11/1998 | Bevan et al. ............... 257/442 |
| 5,989,933 A | | 11/1999 | Bevan et al. |
| 6,045,614 A | * | 4/2000 | de Lyon et al. ............ 117/100 |
| 6,657,194 B2 | * | 12/2003 | Ashokan et al. .......... 250/338.4 |

FOREIGN PATENT DOCUMENTS

| | | | |
|---|---|---|---|
| EP | 0 619 615 A | | 10/1994 |
| FR | 2763608 A1 | | 11/1998 |
| GB | 2 132 017 A | | 6/1984 |
| GB | 2 202 236 A | | 9/1988 |
| JP | 64-002375 | | 1/1989 |
| JP | 04-193793 | | 7/1992 |
| JP | 06177038 A | | 6/1994 |
| JP | 07-014767 | | 1/1995 |
| WO | 01/20687 A1 | | 3/2001 |
| WO | 02/084741 A | | 10/2002 |

OTHER PUBLICATIONS

Ebe et al, "Direct growth of CdTe on (100), (211), and (111) Si by metal organic chemical vapour deposition",J. Electronic Materials 28(8) 1996 pp. 1358-1361.

Maruyama et al, "Growth of (111) HgCdTe on (100) Si by MOVPE using metal organic tellurium absorption and annealing", J. Electronic Materials 25(8) 1996 pp. 1353-1357.

Phillips et al, "Control of very long wavelength infrared HgCdTe detector cut-off wavelength", J. Electronic Materials 31(7) 2002 664-668.

Zandian et al, "Mid-wavelength infrared p-on-n Hg1-xCdxTe heterostructure detectors: 30-120 Kelvin state of the art performance", J. Electronic Materials 32(7) 2003 pp. 803-809.

Shigenaka et al, "Orientation dependence of HgCdTe epitaxial layers grown by MOCVD on silicon substrates", J. Electronic Materials 25(8) 1996 pp. 1347-1352.

Hall et al, "Long wavelength infrared focal plane arrays fabricated from HgCdTe grown on silicon substrates", Proc. SPIE vol. 5406, 2004, pp. 317-322.

Hall et al, "High-performance long-wavelength HgCdTe infrared detectors grown on silicon substrates", Applied Physics Letters, 85(11), 2004, pp. 2113-2115.

International Search Report for PCT/GB2005/003015 mailed Oct. 6, 2005.

GB Search Report for GB 0501676.1 date of search Jun. 28, 2005.

International Search Report of PCT/GB2005/001322, mailed Aug. 25, 2005.

GB Search Reports for GB 0407804.4, dated Jul. 15, 2004 and Jan. 14, 2005.

Nouhi et al.; "Molecular Beam Epitaxy and Metalorganic Chemical Vapor Deposition Growth of Epitaxial CDTE on (100) GAAS/SE and (111) GAAS/SI Substractes", Applied Physics Letters, American Institute of Physics, vol. 52, No. 24, Jun. 13, 1988, pp. 2028-2030, XP000020280.

Johnson et al; "Direct Growth of CDZNTE/SI Substrates for Large-area HGCEDTE Infrared Focal Plane Arrays", Journal of Electronic Materials, vol. 24, No. 5, May 1, 1995, pp. 467-473, XP000571373.

Hall et al; "High-Performance Long-Wavelength HGCDTE Infrared Detectors Grown on Silicon Substrates", Applies Physics Letters, Institute of Physics, vol. 85, No. 11, Sep. 13, 2004, pp. 2113-2115, XP001226600.

U.S. Appl. No. 10/594,393; Hails et al.

* cited by examiner

Crystalline IR Detector Material • Circuits Under Poly-Material

Crystalline IR Detector Material

Crystalline Under Protective Mask and Poly-Material

MANUFACTURE OF CADMIUM MERCURY TELLURIDE ON PATTERNED SILICON

This application is the U.S. national phase of international application PCT/GB2005/003015 filed 1 Aug. 2005, which designated the U.S. and claims benefit of GB 0417471.0 filed 2 Aug. 2004, and GB 0501676.1 filed 27 Jan. 2005, and the entire contents of each of which are hereby incorporated by reference.

This invention relates to a method of manufacturing cadmium mercury telluride on patterned silicon, especially to a method of manufacturing cadmium mercury telluride layers directly onto integrated circuits and the cadmium mercury telluride structures so grown.

BACKGROUND OF THE INVENTION

Cadmium mercury telluride, $Hg_{1-x}Cd_xTe$, is well known as a material for use in infrared devices, such as detectors, sources, LEDs, negative luminescence devices etc. Cadmium mercury telluride, referred to as CMT (or sometimes mercury cadmium telluride—MCT) is a semiconductor alloy, the bandgap of which can be varied by altering the composition of the alloy, i.e. the cadmium content x. The band gap may be tuned so that CMT can be used for a range of infrared devices covering short wave (SW), medium wave (MW), long wave (LW) and very long wave (VLW) infrared wavelengths. CMT is the material of choice for many infrared focal plane array applications. Low leakage current and high carrier mobility result in detectors with excellent sensitivity. CMT is the best solution for single and multi-band systems covering a wide range of wavelengths because it is possible to tune the wavelength by selecting the appropriate composition and it is possible to design and grow structures where the composition is tuned so that two or more wavelengths are operational within a single device.

The general principle for fabricating infrared devices is well established. CMT is grown epitaxially onto a crystalline substrate. Devices are then formed by mesa etching, ion implantation or ion beam milling. Metal contacts are then formed and the devices bonded to a silicon read out circuit. Note that CMT is also grown as bulk crystals from which devices are made by ion implantation or ion beam milling but epitaxial growth can be advantageous over bulk crystal growth.

Various epitaxial growth methods have been suggested for fabricating CMT. Metal-organic vapour phase epitaxy (MOVPE) has been successfully used as a technique for reproducible and uniform growth over large areas. U.S. Pat. No. 4,650,539 describes manufacture of CMT using MOVPE. U.S. Pat. No. 4,566,918 is a modification of this technique which grows thin layers of CdTe and HgTe which interdiffuse to form a uniform CMT structure. U.S. Pat. No. 4,950,621 describes a MOVPE technique for CMT growth which uses a photocatalytic decomposition of the metal-organic compounds.

Other methods for growing CMT include molecular beam epitaxy (MBE). Infrared devices have been formed from CMT grown on a cadmium zinc telluride ($Cd_{1-y}Zn_yTe$ also known as CZT) substrate by an MBE process. See for example; M Zandian, J D Garnett, R E Dewames, M Carmody, J G Pasko, M Farris, C A Cabelli, D E Cooper, G Hildebrandt, J Chow, J M Arias, K Vural and D N B Hall, J. Electronic Materials 32(7) 803 (2003) "Mid-wavelength infrared p-on-n $Hg_{1-x}Cd_xTe$ heterostructure detectors: 30-120 Kelvin state of the art performance", or J D Phillips, D D Edwall and D L Lee J. Electronic Materials 31(7) 664 (2002) "Control of very long wavelength infrared HgCdTe detector cut-off wavelength".

Infrared imaging applications increasingly demand large area, two dimensional detector arrays for long range detection and identification. As the physical size of these arrays has increased so the limitations of traditional substrate materials and growth techniques for CMT have become apparent. Cadmium zinc telluride has been widely used as a substrate for CMT growth but is only available in small sizes which limits its usefulness for the production of large arrays. Cadmium telluride, which has likewise been used as a substrate, is also only available in small sizes. Further, both CdTe and CZT are extremely fragile and the crystal quality is not particularly good.

Gallium arsenide (GaAs) substrates are available in relatively large sizes. However as mentioned the devices are usually bonded to a silicon read-out circuit. In operation detectors are often cooled to low temperatures, for example around 80K (although different devices work best at different temperatures) to reduce thermal noise. At the operating temperatures of the detectors the thermal mismatch between the silicon read out circuit and GaAs substrate can cause delamination of the infrared devices from the circuitry. This effect can be reduced by thinning the substrate but thinning processes can be complex, reducing yields and increasing production costs. This problem of thermal mismatch also applies to cadmium telluride and CZT substrates.

Silicon has been proposed as a substrate because a silicon substrate would inherently be thermally matched to the read out circuitry.

MBE techniques have been applied to growing CMT on silicon, growing buffer layers on the silicon prior to CMT growth, for example;—T J de Lyon, J E Jensen, M D Gorwitz, C A Cockrum, S M Johnson and G M Venzor, J. Electronic Materials 28, 705 (1999). MBE growth of CMT on silicon has proved a challenging task. Firstly, for MBE growth of CMT on any substrate the growth temperature must be accurately controlled, requiring reproducible wafer mounting techniques and fine substrate temperature control. Secondly, material defects have proved difficult to eliminate. These defects do not always have a severe effect on medium wavelength infrared device characteristics (depending on the device) but they do detrimentally affect long-wavelength devices. Consequently growth of CMT on silicon by MBE is a difficult process and has only produced acceptable mid-wavelength infrared devices and arrays.

MOVPE growth of CMT on silicon to produce working devices has also been problematic. See J. Electronic Materials 25(8) (1996) page 1347 K Shigenaka, K Matsushita, L Sugiura, F Nakata and K Hirahara, M Uchikoshi, M Nagashima and H Wada "Orientation dependence of HgCdTe epitaxial layers grown by MOCVD on silicon substrates", page 1353 K Maruyama, H Nishino, T Okamoto, S Murakami, T Saito, Y Nishijima, M Uchikoshi, M Nagahima and H Wada "Growth of (111) HgCdTe on (100) Si by MOVPE using metal organic tellurium absorption and annealing", or Page 1358H Ebe, T Okamoto, H Nishino, T Saito and Y Nishijima, M Uchikoshi, M Nagashima and H Wada "Direct growth of CdTe on (100), (211), and (111) Si by metal organic chemical vapour deposition".

More recently it has been reported that CMT can be produced on a silicon substrate by growing buffer layers on the substrate by MBE and then growing CMT by MOVPE; "Long wavelength infrared focal plane arrays fabricated from HgCdTe grown on silicon substrates", D J Hall, L Buckle, N T Gordon, J Giess, J E Hails, J W Cairns, R M Lawrence, A Graham, R S Hall, C Maltby and T Ashley Presented at Defense and Security Symposium 2004 (Formerly Aero-Sense) 12-16 Apr. 2004 Gaylord Palms Resort and Convention Center Orlando (Kissimmee), Fla. USA, Conference proceedings in press and "High performance long-wavelength HgCdTe infrared detectors grown on silicon substrates", D J Hall, L Buckle, N T Gordon, J Giess, J E Hails, J W Cairns, R M Lawrence, A Graham, R S Hall, C Maltby and T Ashley, Applied Physics Letters Volume 85, Issue 11, pp. 2113-2115.

This technique allows the growth of CMT onto silicon which can then be processed for device formation and bonded to read out circuitry.

However this still requires that, prior to bump bond hybridisation, the wafers of the detector arrays and read out integrated circuits (ROICs) are sawn into individual components ready for the hybridisation process. This is an expensive technique and sawing wafers and bonding can be relatively low yield.

International Patent Application WO02/084741A2 describes a monolithic infrared sensing device where CMT layers are grown directly on a silicon read out circuit. The method described in this patent application involves forming a growth window on the silicon substrate in which is grown a buffer layer of cadmium telluride and then layers of CMT by MBE. This again however relies on MBE growth of CMT on silicon with the attendant difficulties.

BRIEF SUMMARY OF THE INVENTION

Thus according to the present invention there is provided a method of fabricating an infrared device comprising the steps of taking a silicon substrate having an integrated circuit formed thereon, selectively growing at least one crystalline buffer layer in at least one growth window by molecular beam epitaxy (MBE) and selectively growing at least one crystalline CMT layer on said buffer layer by metal-organic vapour phase epitaxy (MOVPE).

The method of the present invention therefore provides a method of fabricating an infrared device where CMT is grown directly on the substrate bearing an integrated circuit, for instance a read out circuit. This avoids the need for hybridisation of a CMT on substrate layer to a circuit layer. The method therefore avoids low yield techniques, e.g. sawing and bonding, in the hybridisation step and allows wafer scale processing of infrared devices.

The crystalline CMT layer is grown in at least one growth window on the substrate by first growing a buffer layer by molecular beam epitaxy (MBE). A layer of CMT is then grown by metal-organic vapour phase epitaxy.

The present invention therefore combines both MBE and MOVPE to produce CMT which can be used in devices at a wide range of wavelengths with good properties. Whilst the method of the present invention does require two distinct processing steps, adding to the complexity of the method, mixing the two techniques can provide a reliable and controllable process that has produced excellent devices.

BRIEF DESCRIPTION OF THE DRAWINGS

The invention will now be described by way of example only with reference to the following drawings of which.

DETAILED DESCRIPTION OF THE INVENTION

Figure 1:
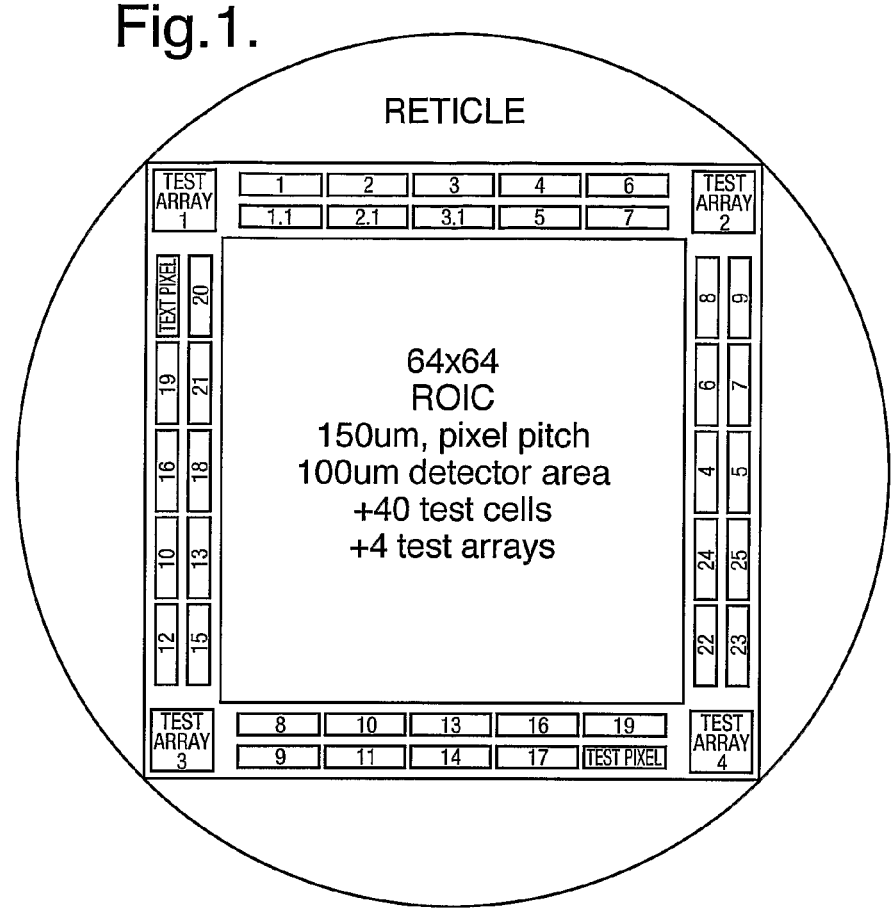
FIG. 1 shows a schematic of a test ROIC designed to prove the invention.

As used in this specification the term cadmium mercury telluride means $Hg_{1-x}Cd_xTe$ where the composition, x, is controlled to lie between 1 and 0 inclusive. When x is 1 the substance is actually cadmium telluride and when x is 0 the material is actually mercury telluride but both shall be included within the term cadmium mercury telluride or CMT for the purposes of this specification.

Substrate orientation is important to achieve single crystal growth of CMT on silicon and preferably the substrate orientation is (001) misaligned by a few degrees, i.e. between 2° and 10° towards <110> or <111>. The step of taking a substrate having an integrated circuit fabricated thereon preferably therefore involves taking a substrate having an orientation of (001) misaligned, preferably between 2° and 10° or between 4° and 8°, toward <110> or <111>, although <111> is generally most preferred.

It should be noted that the growth method of the present invention results in the material grown, both by MBE and later by MOVPE, following the orientation of the substrate. Therefore the MBE buffer layer or layers follow the (001) orientation of the silicon substrate, the mis-alignment of the substrate ensuring single crystal growth. The MOVPE layers also then follow the (001) orientation and so the CMT layers are (001). The present method therefore involves the step of growing at least one buffer layer by MBE and at least one CMT layer by MOVPE, each buffer layer and CMT layer having a crystal orientation that follows the substrate orientation.

It should also be noted that the technique disclosed in WO 02/084741, which is an all MBE process, rather than using both MBE and MOVPE as in the present invention, teaches a mis-orientation of the silicon substrate of only 1°. The present inventors have found that this degree of mis-orientation is unlikely to be sufficient for the present invention. More importantly the method described in WO 02/084741 does not clearly teach in which direction the silicon should be mis-oriented which the present inventors have found to be an important parameter. It appears that this method teaches (111) growth of CdTe (page 14) and so it is likely that the CMT layers also have a (111) orientation, rather than the buffer layers and CMT layers following the orientation of the substrate as with the present invention.

The method may therefore involve fabricating an integrated circuit on a silicon substrate misaligned from (001) towards <111> by between 2° and 10°. It should be noted that the usual substrate orientation for integrated circuit formation is (001) with no misalignment. Before the present invention it was not clear whether integrated circuits could be formed on silicon with such a degree of mis-orientation. However the present inventors have found that relatively high yields can be achieved using silicon mis-aligned in this fashion. The fabrication of the integrated circuit uses standard techniques known to one skilled in the art for the particular circuit being produced. As will be appreciated by one skilled in the art the term integrated circuit covers both a single electrical circuit formed on the substrate as well as multiple circuits on a monolithic wafer whether or not the circuits are connected. For instance a read out circuit for a multiple pixel detector where each pixel has associated circuitry unconnected to the circuitry of another pixel shall be regarded for the purposes of this specification as an integrated circuit.

The integrated circuit has a defined area for a growth window for each element of the infrared device being produced, for instance each pixel in a detector or source may have a growth window and associated electronics. The substrate may therefore comprise a plurality of growth windows. A growth window may simply be a free area of silicon or may be defined by an area of the substrate which is at a different level. As will be understood by one skilled in the art after formation of the integrated circuit there will be variations in surface profile due to the circuit architecture. The growth window may therefore comprise a pit with respect to the circuit architecture, i.e. an area lower than the surrounding circuit architecture. The depth of the pit could be defined simply by the height of the circuit architecture on the sides of the pit. However etching of the silicon either within the growth window or without could alter the relative depth of pit with regard to the circuit architecture. The pit depth can be arranged to be substantially the height of the CMT layers with buffer layer or layers giving an overall planar arrangement in the final device.

As will be described later growth of the MBE buffer layer or layers and growth of the CMT by MOVPE can lead to crystalline growth in the growth windows and polycrystalline growth outside of the growth windows, i.e. on the circuits. The polycrystalline material may be later removed by etching. During growth the polycrystalline material may encroach over the growth windows so that the crystalline areas of CMT are smaller than the growth windows. This encroachment can occur when the growth window is formed as a pit compared to the circuit architecture because the circuitry is higher than the growth area and will cause a shadow over the growth window during MBE (MBE works on line of sight). Further, during MOVPE the circuitry will poke up further into the gas streams which may enhance growth on the circuits and polycrystalline material may have higher growth rate than crystalline. It is necessary, in order to isolate the finished devices, to remove the polycrystalline material from on top of the protected circuitry and also that which has formed between the sides of the integrated circuit and the crystalline islands. Therefore when the polycrystalline material is removed the area of crystalline CMT is smaller than the window. Hence the diode/detecting area is smaller than it could be i.e. the fill factor is smaller than it would be if all the area available to it on the circuit was covered in detector material. If all the area available on the circuit for growth, i.e. all the growth window contains good detector material, the diodes could be made smaller resulting in smaller pitch arrays. Smaller pitch can be beneficial for some applications and can be good for array performance as more diodes can be accommodated on an array.

Therefore in another embodiment the growth window may be arranged to be at the same level as the circuit architecture. This is beneficial for growth processes as it essentially represents growing on a planar substrate as far as molecular beams and gas flows are concerned and reduces the risk of circuitry causing shadows to the MBE beams etc as outlined above. Ensuring that the growth window is at the same level as the circuit architecture therefore reduces the chance of encroachment of polycrystalline material into the growth windows. Hence there is less polycrystalline material to remove and the shape/size of the crystalline island more closely matches that of the growth window. The fill factor of the device may therefore be improved.

In yet another embodiment the growth window may be formed by a stub of substrate extending above the circuit architecture. In such an arrangement the growth area will stand proud of the surrounding circuitry, will not be in an MBE shadow and will poke up into the MOVPE gas streams. Depending on the growth conditions used the orientation/crystallinity of material grown on the sides of the stub may vary. The material grown up the sides of the stub will probably have to be removed by etching since, even if it is crystalline, it will be of different orientation, thickness, composition and doping to the desired structure grown on top of the stub with a correct orientation and hence will give different device performance. However all of the area of the top of the stub will be good quality crystalline material ensuring that all of the defined growth window is used effectively. Therefore growing on a stub of silicon can have advantages in terms of device size and fill factor.

An area of the substrate which is defined as a growth window may therefore be processed to be at a different level to the rest of the substrate. It may also be possible to process the area of the substrate which is intended to be a growth window so as to have a different orientation to the rest of the substrate. This would allow the substrate on which the integrated circuit is fabricated to have the standard (001) orientation but the areas of the substrate corresponding to growth windows could be processed, for example etched, to have the required mis-orientation for single crystal growth of CMT.

Preferably the substrate outside of a growth window is covered with a mask material. In other words a growth window is defined by an absence of mask material. The method may therefore involve the step of applying a mask material to the substrate outside of the growth window(s) prior to growth of the buffer layer. A mask material helps protect the integrated circuit and the rest of the substrate during the preparation for and growth of the buffer layer and CMT layer. Further the mask material can help define the growth window(s) and aid in selective crystalline growth of the buffer layer(s) and CMT layer. Conveniently the mask material may be applied to the whole substrate having an integrated circuit formed thereon and then selectively removed from certain areas to reveal growth windows. The skilled person will be aware of methods for applying a mask material and then removing selected portions thereof, for instance photolithography.

The mask material may be any material that is chemically and mechanically robust so as to protect the substrate and integrated circuit during the preparation and growth of CMT but is removable once the CMT processing is finished to expose the underlying circuitry. One convenient mask material is titanium tungsten, Ti—W, although other materials could be used such as silicon dioxide ($SiO_2$), silicon nitride ($Si_3N_4$), Aluminium (Al), Chromium (Cr), Platinum (Pt), Palladium (Pd), or other refractory metals.

Preferably the exposed silicon in the growth window(s) is cleaned for material growth prior to MBE growth of the buffer layer. This cleaning removes any unwanted contamination. The preparation may involve one or more of solvent cleaning, barrel ashing and/or ion beam milling. The substrate is also etched using a hydrofluoric acid (HF) based etch.

It should be noted that it is usual to perform a thermal clean of the silicon substrate prior to material growth in standard growth methods on a plain substrate, i.e. prior to growth of the buffer layers by MBE for example. However thermal cleaning, which can involve temperatures of up to 800° C., would destroy the integrated circuit. Therefore traditional thermal cleaning can not be performed on the substrate bearing the integrated circuit. Tests have shown that the integrated circuits can survive processing temperatures of up to about 500° C. but that at much above this temperature the metal tracks of the circuit can melt damaging the circuits.

Prior to MBE buffer growth the substrate is exposed to an arsenic flux under temperature, i.e. above room temperature, but at a low enough temperature that the integrated circuit is not damaged. The arsenic flux prepares the hydrogen terminated surface of the silicon substrate for subsequent MBE growth. Arsenic is a preferred material for the cleaning flux but other materials or combinations thereof could be used instead or in addition such as, cadmium, tellurium, cadmium telluride, zinc telluride, antimony or phosphorous.

The present invention therefore makes use of a low temperature cleaning process at around 450° C. that gives good cleaning but without damaging the integrated circuit. The subsequent growth steps occur at lower temperatures than the traditional thermal clean and so do not cause so much of a problem to survivability of the integrated circuit.

One or more buffer layers may be grown by MBE. The buffer layers set the correct orientation for MOVPE growth—as noted the growth of the MBE buffer layers follows the orientation of the substrate—and prevent chemical contamination of the CMT by species in the substrate. The buffer layers also act to keep mercury in the later grown CMT layers away from the circuitry in the substrate. Suitable buffer layers include cadmium telluride and zinc telluride. There may be a single buffer layer, e.g. a single layer of zinc telluride or a combination of layers, for instance a layer of zinc telluride may be grown on the substrate with a layer of cadmium telluride grown on top. Cadmium zinc telluride may also be used as a buffer layer. Other buffer layers could include gallium arsenide and germanium.

To grow zinc telluride either zinc telluride may be used as the MBE source material or elemental zinc and tellurium may be used, or a combination of the elemental and compound materials. Similarly the cadmium telluride may be grown using elemental cadmium and tellurium or cadmium telluride or a combination. The buffer layers are grown using standard MBE growth processes which the skilled person will be aware of.

The entire substrate is exposed to MBE growth but due to suitable preparation of the growth window(s), for example use of a suitable mask material, crystalline growth only occurs in the growth window(s) as it is only in the growth window(s) that the crystalline substrate is exposed as a base for epitaxial growth. Material deposited on the substrate outside of the growth window is deposited as polycrystalline material. Depending on the process conditions it may be possible to ensure growth only in the growth windows, i.e. there is no growth outside of the growth window and crystalline growth within the growth window. This is known in the industry as "selected area growth" and would give better fill factors as the area of grown CMT would (more closely) equal the area of the growth window. However to date it has proved more convenient to allow growth outside of a growth window and remove unwanted material in a later etching stage.

After the MBE growth of the buffer layers CMT may be grown on the buffer layers by MOVPE. However it may be preferable to clean the surface of the buffer layers prior to MOVPE growth. Depending on the equipment used it may be necessary to transfer the buffered substrate from an MBE growth apparatus to an MOVPE reactor and/or there may be a delay between processing steps. If the buffered substrate is not kept in a controlled environment there may be impurities which build up on the surface of the top buffer layer. Cleaning will remove at least some of these impurities but, similarly to substrate preparation, any cleaning steps should not damage the integrated circuit. Cleaning may be performed by etching the buffered substrate as is well understood by one skilled in the art of MOVPE or by any suitable cleaning processes, with the constraint on temperature mentioned above. If a combined MBE/MOVPE system complete with load lock between the two parts is in place cleaning is not needed.

Prior to growing the at least one CMT layer the method may further comprise the step of growing at least one further buffer layer by MOVPE. This MOVPE buffer layer may be the same as or different to a buffer layer material grown by MBE. As mentioned above MBE gives a good controllable way of growing suitable buffer layers on silicon with the correct orientation for MOVPE growth. In order to further improve conditions for MOVPE growth of CMT however it may be useful to lay down a buffer layer by MOVPE. For instance when the MBE buffer layer comprises a top layer of cadmium telluride grown on a base layer zinc telluride on the substrate the method may comprise the step of growing a further cadmium telluride layer by MOVPE on top of the MBE CdTe layer.

Growing a further buffer layer by MOVPE can increase the buffer layer thickness which can be beneficial in some embodiments and MOVPE is a faster growth method than MBE. The MOVPE buffer layers can improve the crystal quality. Further MOVPE buffer layers are also useful in isolating the CMT from the surface which has been exposed to the atmosphere, i.e. laying down an MOVPE buffer layer can cover over any slight surface impurities due to oxidation etc of the MBE buffer layer and any residue of the cleaning process, if performed.

Growth of the CMT layer is by standard MOVPE techniques whereby the concentration of the precursors entering the reactor are controlled by their vapour pressure and the gas flow (conveniently hydrogen) through the bubblers containing the precursors possibly with further dilution by an additional clean gas ($H_2$) flow. In this way $Hg_{1-x}Cd_xTe$ can be grown with a controlled value of x so as to give desired device characteristics. Conveniently the MOVPE process uses the interdiffused multi-layer process of CMT growth as described in U.S. Pat. No. 4,566,918, i.e. the step of growing CMT comprises sequentially growing thin layers of CdTe and HgTe which interdiffuse during growth to give a single layer of CMT, the relative thicknesses of the CdTe and HgTe layers determining the cadmium content x.

The organometallic precursors used are any suitable volatile tellurium and cadmium compounds such as an alkyl of cadmium and of tellurium. In one embodiment the tellurium precursor is di-iso-propyltelluride and the cadmium precursor is dimethylcadmium.

As any MOVPE buffer layers and the CMT are grown on the MBE buffer layers they will take the crystal orientation therefrom. Again then there will be crystalline growth only within the growth windows with polycrystalline growth elsewhere.

The CMT layer may be doped with a suitable dopant which may be n-type or p-type. Suitable dopants include iodine, arsenic, indium and antimony although other dopants could be used. Suitable precursors include iso-butyliodide and tris (dimethylamino)arsenic.

Generally the method will comprise growing more than one layer of CMT according to the requirements of the intended device. Different layers may have different thicknesses, compositions (x in $Hg_{1-x}Cd_xTe$), and/or different dopants and dopant concentration.

Following growth of the CMT layers by MOVPE it is preferable to anneal the material in a mercury rich environment—this fills the mercury vacancies and ensures the desired electrical properties. The annealing may be carried out in a MOVPE reactor and may be performed directly after growth of the CMT layers or it may be performed later using any suitable apparatus.

The MBE growth of buffer layers and MOVPE growth of CMT uses substantially the method described in "Long wavelength infrared focal plane arrays fabricated from HgCdTe grown on silicon substrates", D J Hall, L Buckle, N T Gordon, J Giess, J E Hails, J W Cairns, R M Lawrence, A Graham, R S Hall, C Maltby and T Ashley Presented at Defense and Security Symposium 2004 (Formerly AeroSense) 12-16 Apr. 2004 Gaylord Palms Resort and Convention Center Orlando (Kissimmee), Fla. USA, Conference proceedings in press and "High performance long-wavelength HgCdTe infrared detectors grown on silicon substrates", D J Hall, L Buckle, N T Gordon, J Giess, J E Hails, J W Cairns, R M Lawrence, A Graham, R S Hall, C Maltby and T Ashley Applied Physics Letters Volume 85, Issue 11, pp. 2113-2115 and also that described in UK patent application no. GB0407804.4 the contents of all of which are incorporated by reference hereto.

Where material is grown which is crystalline in the growth window and polycrystalline outside of the growth window it is necessary to remove unwanted material. The method may therefore include the step of removing any unwanted CMT and/or buffer layer material. Removal of the polycrystalline material may be achieved by etching. Preferably the etching step involves a dry etching step followed by a chemical wet etch. Photolithography may be used to define the areas to be etched. The removal of unwanted material may be performed at different stages. For instance both the MBE and MOVPE growth stages may be completed before removal of the polycrystalline buffer and CMT material. Alternatively the MBE growth of buffer layers may be completed and any unwanted polycrystalline buffer layer material removed at this stage, i.e. prior to the MOVPE growth stage. MOVPE growth may then be performed with crystalline growth only on the crystalline buffer layers. The MOVPE growth stage could achieve selective area growth so that there is no growth at all outside of the growth area, or it could again result in crystalline growth on the crystalline material in the growth window and polycrystalline growth elsewhere, in which case there will also be need for an etching step after MOVPE growth.

The method may also involve device processing steps to define the physical shape of the CMT layers. This step may also involve providing landing sites for electrical connections. Conveniently the device processing is performed at the same time as the removal of any unwanted CMT/buffer material.

Device processing steps may include planar processing techniques and may include ion implantation, ion beam milling and the formation of cones or lenses for example. Ion implantation allows for the implantation of p/n type dopants after the CMT has been grown to form diodes or other structures—thus the CMT material may be grown with some layers undoped or partly doped and doped later through ion implantation.

The method may also involve the step of coating the CMT with at least one passivation layer. As will be understood by one skilled in the art the side walls of the CMT structure are preferably coated with one or more passivating layers to ensure electrical stability of the device and prevent loss of mercury from the material. The passivating layer may conveniently be a layer of cadmium telluride. Conveniently the passivation layer is an epitaxial layer grown by MOVPE.

The method may also involve the step of removing any mask material from the substrate outside of the growth windows. This may be achieved by an etching process such as a chemical wet etch as will be understood in the art.

The method may also include the step of making electrical connections between the CMT and the integrated circuit. The electrical connections could be formed as an air bridge by depositing a sacrificial material, depositing a conductive material on the sacrificial material and then removing the sacrificial material as is well understood by one skilled in the art. Alternatively where a passivation layer is applied to the CMT material, electrical connections may be made through vias in the passivation material. Obviously the relationship between the CMT material and the integrated circuit will determine how the electrical contacts are to be made. Where the buffer layers/CMT are grown in a pit with respect to the circuit architecture part of the device could be in direct contact with the integrated circuit. Where the final device is planar with respect to the circuit an electrical connection could be made without the need for an air bridge. The type of connection needed, and degree of passivation etc. required will vary with device design as will be understood by one skilled in the art.

It should be noted that as described in UK patent application no. GB0407804.4 the method of growing CMT allows for further epitaxial growth of CMT on CMT layers that have undergone device processing. Therefore the method of the present invention may involve growth of part of a CMT structure followed by device processing followed by MOVPE growth of at least one additional CMT layer. The at least one additional CMT layer would be epitaxial on the crystalline CMT areas. Device processing could include any kind of shaping step, such as etching, or could involve fabricating electrical contacts. Specifically the method could allow for growth of one or more CMT layers, forming of electrical contacts to that part of the structure and then further growth of at least one additional CMT layer.

The present invention therefore provides a method for forming monolithic infrared devices with the circuitry and infrared active material on the same substrate. The devices enabled by the present invention include Short wave detectors and sources, Medium wave detectors and sources, Long wave detectors and sources and Very longwave detectors and sources. In all cases full 2D arrays can be produced with the CMT material fully integrated with the circuitry for each pixel. Dual band, Multi-band, hyperspectral and avalanche devices can be produced using CMT grown by the present invention. Negative luminescence devices can be fabricated as can LEDs and single photon sources and the devices can be used in a range of technology from focal plane array infrared detectors to gas sensors. Transistors can also be fabricated using the method of the present invention.

The CMT grown in the at least one growth window could also be processed to fabricate integrated circuits thereon. Integrated circuits fabricated in CMT would have different properties to those fabricated on the silicon substrate, for instance they could be faster and lower power. Therefore local high speed circuits could be fabricated within CMT islands within the main silicon integrated circuits.

Thus according to another aspect of the invention there is provided a monolithic infrared device comprising a silicon substrate having an integrated circuit fabricated thereon and at least one layer of cadmium mercury telluride formed on at least one buffer layer on said substrate wherein the substrate has an orientation of (001) aligned by 2° to 10° inclusive towards <110> or <111>, preferably <111>.

The device according to the present invention may be fabricated by the method of the first aspect of the invention with all of the attendant advantages thereof. The device preferably comprises a plurality of CMT structures each having its own associated circuitry. Conveniently the device is an infrared detector having a plurality of detector pixels. The device may be a linear array or a 2D detector array.

Whilst the method of the present invention is directed to growth of CMT on silicon substrates bearing an integrated circuit it has been found that the CMT grown in a growth window has an excellent surface morphology. For CMT grown by conventional methods the maximum array size and operability can be limited by large defects known as hillocks. Typical defect densities for conventionally grown high quality material can be around 10-20 cm$^{-2}$ on plain silicon. The defect density in material grown in windows is much less than this. Therefore growth of CMT in growth windows offers a method of growing larger area, high quality detector arrays or other infrared devices.

Thus in another aspect of the invention there is provided a method of fabricating a monolithic array of CMT structures comprising the steps of taking a monolithic substrate material having a plurality of defined growth windows and selectively growing at least one layer of crystalline cadmium mercury telluride within said growth windows.

The present method therefore can be applied to the growth of larger area and/or higher quality arrays of CMT devices than other growth techniques. The growth substrate may be any suitable crystalline material and may conveniently be physically robust and available in large areas. The substrate could be a substrate bearing an integrated circuit or some other surface features or could be a plain substrate with defined growth windows. Suitable substrate materials include cadmium telluride, zinc telluride, cadmium zinc telluride, cadmium zinc selenide and cadmium zinc selenide telluride (although these are generally not available in large sizes), gallium arsenide, silicon, germanium, indium antimonide, indium aluminium antimonide, indium gallium antimonide, indium phosphide, sapphire, alumina or spinel ($MgAl_2O_4$).

This aspect of the present invention may therefore be used in the production of high quality hybridised devices. In such case silicon is a preferred substrate as it is inherently thermally matched with the read-out circuit. Selected area growth for hybridisation also offers the advantage that strain within the material is reduced and so there will be less bowing of the substrate/CMT. This effect is greatest when growth only occurs in growth windows.

Preferably the growth windows are defined by the substrate bearing a mask material applied outside of the growth windows. The method may therefore include the step of applying a mask material to the substrate outside of the growth windows prior to CMT growth. Conveniently the entire substrate is covered in a mask material and then selected areas of mask material are removed to expose the growth windows. Standard photolithography techniques may be used to define the growth windows using mask material.

The skilled person will be aware of various materials that may be used as a mask material. Where the substrate is a plain substrate without an integrated circuit formed thereon the mask material need only prevent crystalline growth of CMT outside of the growth windows. Suitable mask materials include Ti—W, silicon dioxide ($SiO_2$), silicon nitride ($Si_3N_4$), Al, Cr, Pt, Pd, and other refractory metals.

Preferably the step of growing at least one CMT layer involves the steps of growing at least one crystalline buffer layer in each growth window by MBE and then growing at least one crystalline CMT layer on the buffer layers by MOVPE. As mentioned above this method of growing CMT produces high quality CMT devices with controllable properties. All of the embodiments and advantages described above with relation to growth of buffer layers by MBE and CMT layers (and any additional buffer layers) by MOVPE are equally applicable to this aspect of the invention.

As mentioned above with respect to the first aspect of the invention orientation of the substrate is important in ensuring the correct material growth. The orientation should allow correct growth of the buffer layers by MBE and ensure that the buffer layers have the correct orientation for the growth of CMT by MOVPE. The substrate is therefore preferably arranged to be misaligned from the form {100} in either the <111> or <110> directions. Preferably the degree of misalignment is between 2° and 10°. Mis-aligning the substrate orientation in this way prevents the build up of defects in the MBE buffer layers. When the substrate is silicon the substrate orientation is preferably (001) mis-aligned towards the [111] direction and the degree of mis-alignment is preferably in the range of 2°-10° inclusive, more preferably between 4° and 8° inclusive. Silicon is generally a more difficult substrate to grow on and correct orientation can be important.

Preferably the method involves the step of cleaning the substrate in the growth windows prior to material growth. This can be through a combination of solvent cleaning, etching, barrel ashing and ion beam milling as well as HF based etching as described above but where the substrate does not bear an integrated circuit standard thermal cleaning techniques may be used as well.

After growth of the CMT material the method may involve the step of removing unwanted CMT material by etching. Where a mask material is used this allows crystalline growth only in the growth windows but poly-crystalline growth elsewhere; therefore the poly-crystalline material will need to be removed. This step may include a device processing step for forming the shape of the required device.

The method may also involve the step, after device formation, of removing any mask material. As described above this can be performed by standard etching/photolithography techniques.

The method as described above can be used to produce a series of islands of CMT on buffer layers on a substrate. The method may then involve further growth of a material over the whole substrate, i.e. over the CMT islands and bare substrate. This can result in an array of islands of CMT buried in another material For example CMT could be buried under CdTe, islands of CMT material tuned for long wavelength operation could be buried in CMT material tuned for medium or short wavelength operation or CdTe (or HgTe) could be buried in CMT.

Cadmium mercury telluride is used in a range of infrared devices, especially infrared detectors. As focal plane arrays become ever larger, traditional methods of manufacture are being tested to the limit. Hybridisation of a substrate having a detector array to a read out integrated circuit (ROIC) is an expensive and low yield process. The present invention relates to the growth of detector material directly onto a ROIC thus eliminating the need for hybridisation and allowing the fabrication of focal plane arrays with very large areas and high pixel counts using wafer scale processes.

The first stage in production of a detector array fabricated directly on a ROIC is to produce the ROIC. It has been found that for growth of single crystal CMT on plain silicon the orientation of the substrate is important. For silicon the orientation is (001) misoriented by a few degrees towards <111>. The ROIC is therefore fabricated on such a misaligned silicon substrate. Test circuits have been fabricated on misaligned silicon and examined and acceptable yields were obtained indicating it is possible to fabricate ROIC on off-axis silicon. The industry standard approach for manufacturing ROICs is on orientation (100) with no mis-alignment.

It should be noted that the silicon substrate could comprise epitaxial silicon (epi silicon). As the skilled person will be aware formation of an integrated circuit can start with epitaxial growth of silicon on a wafer of bulk silicon prior to formation of the circuits. For the purposes of this specification a silicon substrate includes epi silicon.

Figure 2:
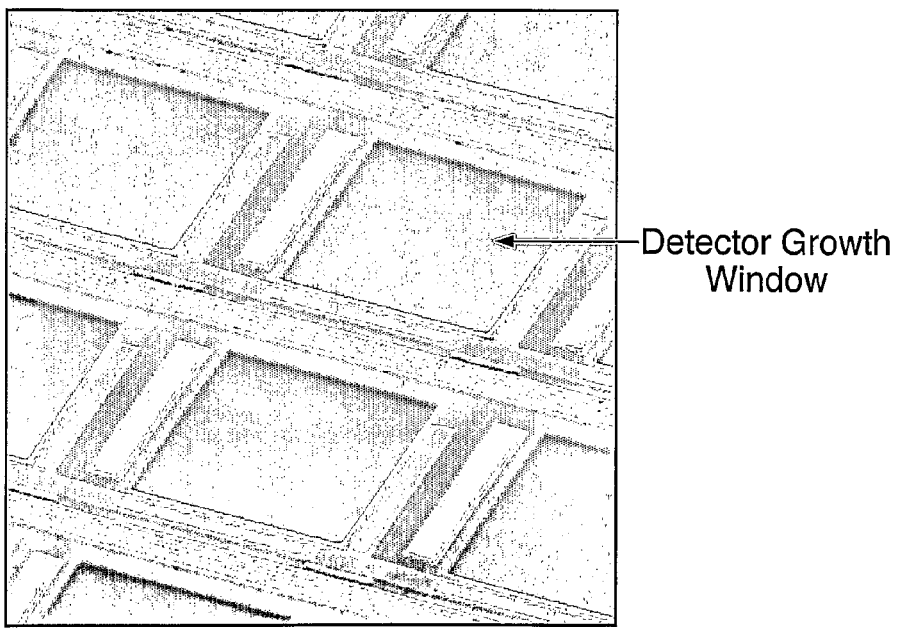
FIG. 2 shows an SEM of growth window on the substrate.

FIG. 1 shows a ROIC layout which was used to prove the principle of the invention. The ROIC contained a range of test circuits, two-dimensional lead-out circuits and a 64×64 pixel ROIC. The circuits have windows opened to the silicon for the growth of detector material. The central area contains a fully functional 64×64 pixel array on a 150 μm pitch. The pixel was of a standard design which included a direct injection gate, stare gate, integration capacitor, reset circuit and a 100 μm square area cleared down to the silicon substrate for the growth of buffer layers and CMT. FIG. 2 shows an SEM of the detector growth windows on the substrate.

It should be noted that the device as described above is a fully 2D array. Each of the 64×64 pixels has its own growth window and associated circuitry. This contrasts with the method described in WO02/084741 in which a single growth window is defined. In WO02/084741 CMT is grown in the growth window and then formed into a linear array or two side by side linear arrays. The present invention allows growth in a plurality of separate growth windows.

Prior to growing the buffer layers and detector material onto the ROIC it was coated with a protective Ti—W mask. Ti—W is preferred as it is more mechanically robust than other investigated protective layers such as aluminium, chromium and silicon dioxide but these materials could be used if required. The Ti—W mask protects the ROIC from chemical contamination/chemical damage/structural damage during the detector material growth, annealing, passivation, device processing and dry etching processes which define the physical structure of the infrared device.

After the Ti—W protective mask has been deposited to protect the circuits, photolithography is used to remove the Ti—W to expose the window areas. This exposes the underlying silicon substrate in readiness for the detector material growth and preparation processes.

After pre-processing, the material layers of the infrared detector, i.e. the CMT detector material and any buffer layers are grown directly onto the ROIC. It is important that single crystal detector material is grown on the ROIC within the growth windows. These windows are carefully prepared in order to remove any unwanted contamination which may give rise to the formation of polycrystalline material in the windows. The window preparation includes solvent cleaning, barrel ashing, ion beam milling and HF based etching, e.g. an HF/alcohol mix. All of these are relatively low temperature cleaning steps (around room temperature) but clean the substrate sufficiently for the material not to be affected by background impurities. The industry standard process for growing materials on silicon substrates involves cleaning the silicon at temperatures of 820° C. Exposing the ROICs to temperatures above 500° C. does however cause the aluminium interconnect tracks to melt and thus the ROIC becomes permanently damaged. This has been overcome by developing a new lower temperature substrate cleaning process.

Part of the cleaning/preparation process involves exposing the substrate to an arsenic flux under temperature. This is conveniently performed when the substrate is loaded into the MBE reactor. The arsenic flux prepares the hydrogen terminated surface of the silicon and is important to allow subsequent MBE growth.

Other cleaning/preparation methods may be used however including hydrogen cleaning and/or heating under P, As, Sb, S, Se, Te, Cd, Zn for example.

Once the window has been prepared for growth a buffer layer is grown by Molecular Beam Epitaxy (MBE) followed by the growth of the infrared detector material by Metal Organic Vapour Phase Epitaxy (MOVPE). The buffer consists of a layer of zinc telluride followed by a layer of cadmium telluride approximately 1 μm thick although a single layer of zinc telluride, cadium telluride or cadmium zinc telluride could be grown instead. The width of buffer layer is variable from say one monolayer of ZnTe (and CdTe if used) up to around 10 μm total thickness.

The infrared detector is a multi-layer CMT diode structure. This diode structure was theoretically modelled and optimised for performance in the medium wave band at 5 μm although clearly other IR devices could be fabricated. More details regarding the MBE and MOVPE growth stages are given later.

The buffer material and subsequent CMT layers are grown selectively as crystalline in the growth windows but as polycrystalline material outside the growth windows. During testing of grown material a performance indicator, 'crystalline yield', was defined as the ratio of windows that have grown crystalline to the total number of pixels within the array. The method of the present invention has been entirely successful in producing high quality, single crystal material with 100% crystalline yield. The background surface morphology of the detector material grown in windows on ROICs is comparable to detector material grown on conventional substrates. Nomarski and scanning electron micrographs are shown below in FIGS. 3 and 4 respectively. The material in the growth windows is crystalline but the material is polycrystalline elsewhere.

As far as larger defects are concerned, the quality of the growth morphology in the windows is excellent. For conventional growth, maximum array size and operability can be limited by large pyramidal defects known as hillocks. A typical hillock density is around 10-20 $cm^{-2}$ for high quality layers on plain Si. The defect density in material grown in windows appears to be much less than this. The present invention also therefore relates to the growth of CMT in windows as a useful technique to produce large area, hillock free material for conventional detector arrays.

After the detector material growth process, an etching recipe is used to remove the polycrystalline material. The crystalline detector material is then ready for the subsequent processing stages. It has been identified that the optimum etching recipe involves a dry followed by a wet chemical etch.

In the dry etching procedure a number of plasma chemistries, largely based on methane, have been identified to dry etch CMT. The radicals within a methane plasma react with cadmium, mercury and tellurium in the CMT to form $Me_2M$ where M is Cd, Te and Hg and Me is $CH_3$. $Me_2Hg$ is also formed by the interaction of $Me_2Cd$ on Hg and CMT and $Me_2Te$ by the interaction of $Me_2Cd$ on Te and CMT. Some of the mercury may also evaporate from the surface. A methane plasma also deposits a polymer in the chamber and an additional gas is usually added to control this. The plasma used in this procedure consists of methane and hydrogen gases in an inductively-coupled plasma system.

Figure 3:
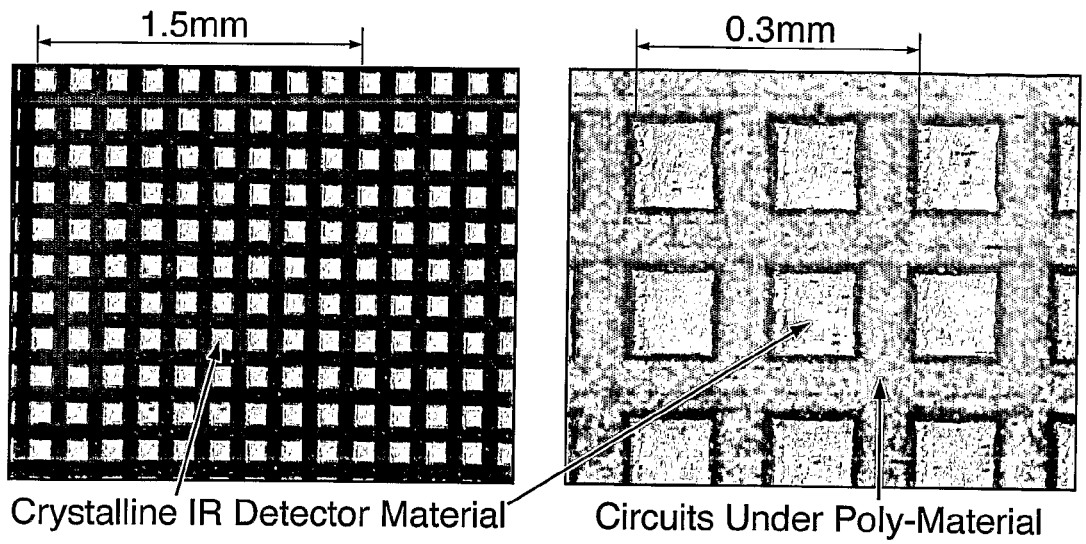
FIG. 3 shows a Nomarski micrograph of the substrate after CMT growth.
Figure 4:
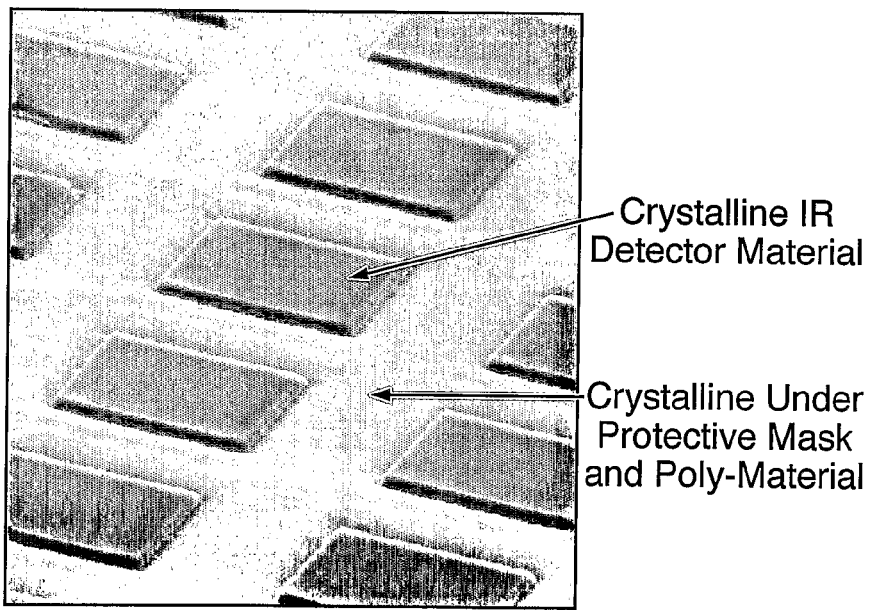
FIG. 4 shows an SEM of the substrate after CMT growth.

Photolithographic techniques are then used to define the areas to be etched; in this case the polycrystalline material. The polycrystalline material shown in FIG. 3 and FIG. 4 is removed by dry etching.

The Ti—W protected mask is then removed by wet etching to reveal the underlying circuitry.

The final processing step is to connect the detector to the ROIC contact pads using metallisation. Contacting can be achieved in one of two ways. A passivation layer may be deposited to prevent a short circuit with the detectors and metal contacts. Holes will need to be opened in the passivation layer in order to make contact with the detector contact regions. Alternatively one can make air bridge contacts thereby avoiding the need for passivation and the risk of short circuits.

Air bridge contacts are currently used for contacting to planar type devices. Air bridges require the use of a temporary resist support structure onto which a chromium/gold metal track is deposited. Removal of the resist leaves the metal interconnect track suspended in the air. This technology has the advantage that an electrically insulating layer is not required.

Higher performance resistance area products can be obtained with passivated CMT infrared detector structures and passivation is preferred for long waveband devices. However, CMT infrared diodes without deposited (e.g. CdTe) passivation, working in the medium wave band have a sufficiently high performance to be background limited.

For other devices electrical contacts may be made at different stages of device growth. The method of growth of the present invention allows for growth of some material layers to be followed by device processing steps such as etching or formation of electrical contacts. For example one or more layers of CMT may be grown by MOVPE onto the buffer layers, any polycrystalline material may then be removed by etching (if needed to be removed), before an electrical contact is made to the CMT layer(s). Further MOVPE growth of CMT will then result in epitaxial growth of one or more further CMT layers. The whole device may then be annealed, passivated and a further electrical connection made.

The fabrication of a focal plane detector array has been described but the skilled person will appreciate that other infrared devices could be fabricated using the method of the present invention.

As mentioned the growth of the buffer layers is by MBE and the growth of the CMT layers is by MOVPE.

Figure 5:
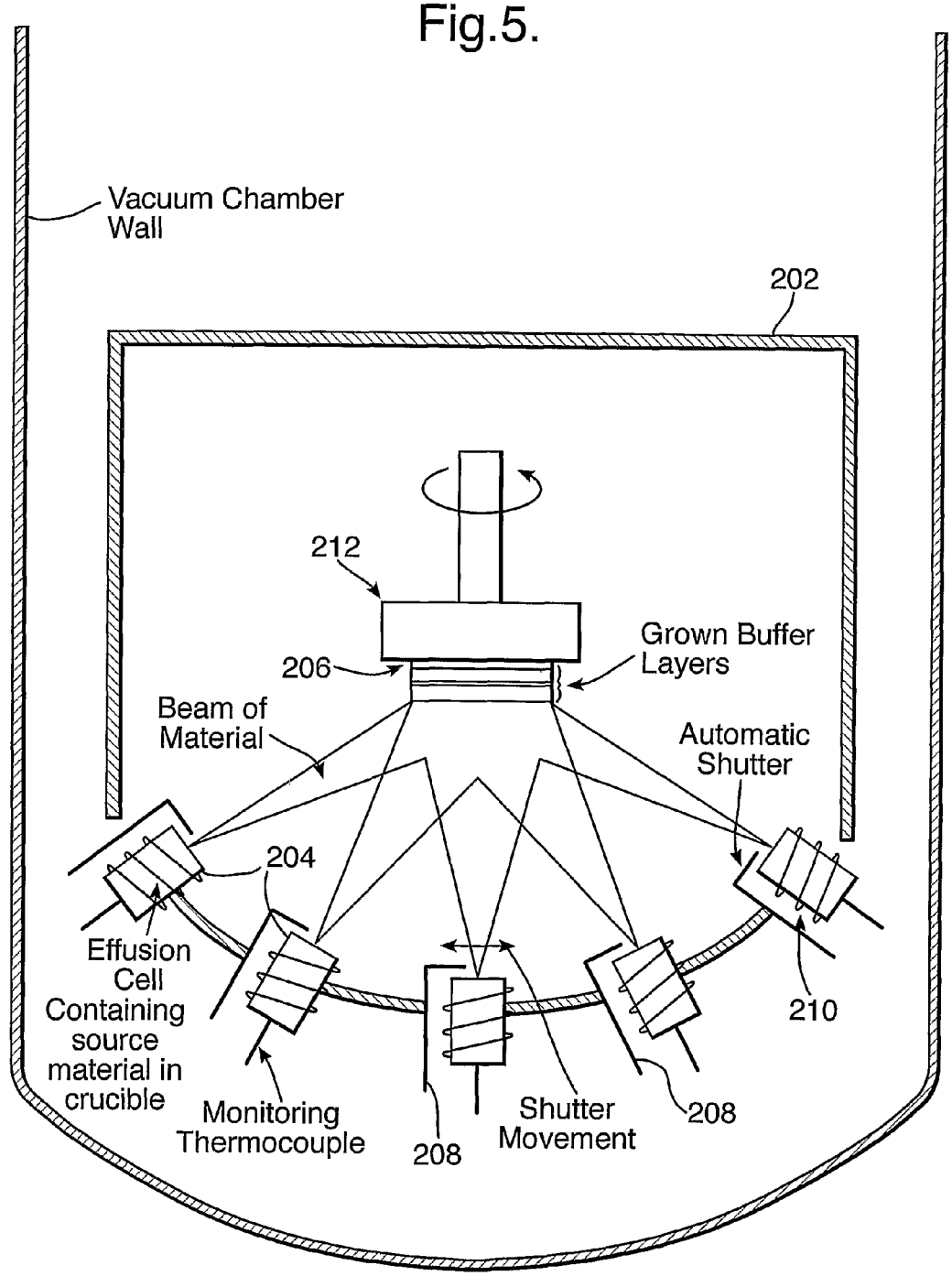
FIG. 5 shows a schematic of an MBE apparatus suitable for growth of the buffer layers.

MBE is a process which takes place in ultra high vacuum. Referring to FIG. 5, the liquid nitrogen 202 shroud assists with maintaining the vacuum. The source materials are contained in crucibles inside effusion cells 204 within the machine. The effusion cells 204 are positioned so that the open ends of the crucibles point at a heated substrate 206. Material is transferred from the crucible to the heated substrate when a shutter 208 over the end of the crucible is removed. The amount of material which is transferred to the substrate is dependent upon the temperature of the crucible, the higher the temperature the higher the vapour pressure of the material and hence the more material is transferred. The heating coils 210 control heating of the crucibles. Because the system is under vacuum, even low vapour pressure materials evaporate if heated sufficiently and can be transferred to the substrate. Again because the system is under vacuum, beams of material are transferred from the effusion cells to the sample without interference from ambient gas. The effusion cells are normally held at an idling temperature where they are kept warm but not hot enough to evaporate material. Before growth is started the cells are warmed to their growth temperature so that sufficient material can evaporate from the crucible to grow the desired layer.

The masked, etched silicon substrates 206 are loaded into the MBE kit via a load lock. The substrate is clipped onto a holder 212 which is heated and ideally also rotates. Rotation assists with the uniformity of the grown layers. The temperature of the substrate during growth is below that at which the deposited material re-evaporates, but is sufficiently hot to allow the atoms to move around on the surface and form crystalline material.

It has been found that it may be beneficial to use an MBE kit which has previously been used to grow the required buffer layers. The effect of previous growth runs may be to condition the MBE kit so as to allow subsequent high quality crystalline growth. With a clean MBE kit it may therefore be beneficial to perform a couple of conditioning growth runs first.

The substrate is then cleaned at temperature (i.e. above room temperature) under an arsenic flux—however the temperature is sufficiently low to avoid any damage to the ROIC.

Zinc telluride growth is then initiated by removing the shutters from in front of the zinc telluride, zinc and tellurium cells as necessary depending on which sources are to be used for the growth. Once the required thickness of zinc telluride has been grown, the shutters are replaced. Likewise the cadmium telluride is grown by removing the shutters from in front of the cadmium telluride, cadmium and tellurium cells as necessary. Again at the end of CdTe growth the shutters are replaced. Once growth is completed, the cells are cooled to the idle temperature and the substrate is cooled and unloaded from the machine.

A thin buffer layer of ZnTe is grown on the windows in the ROICs by MBE to set the substrate orientation to (001) and to improve adhesion of the CdTe buffer layer which is then subsequently grown. CdTe grown directly on silicon by MBE is more prone to flaking from the substrate. The buffer layers have a total thickness of around 1 μm although for some devices could be thicker and could be just zinc telluride or CZT.

Part of the growth process may be carried out using migration enhanced epitaxy (MEE) and for the purposes of this specification references to MBE include references to MEE.

The substrate is then transferred to the MOVPE reactor with any etching/cleaning steps as necessary being performed. To produce a multi-layer device various CMT layers are grown in each growth window, each layer being grown by the interdiffused multi-layer process described in U.S. Pat. No. 4,566,918. Whilst MBE apparatus and MOVPE apparatus are often separate pieces of equipment there is no reason why they could not be combined in a single unit with a load lock or transfer mechanism between the two. A particular piece of kit could be arranged with MBE and MOVPE chambers and a load lock or transfer mechanism between the two.

Figure 6:
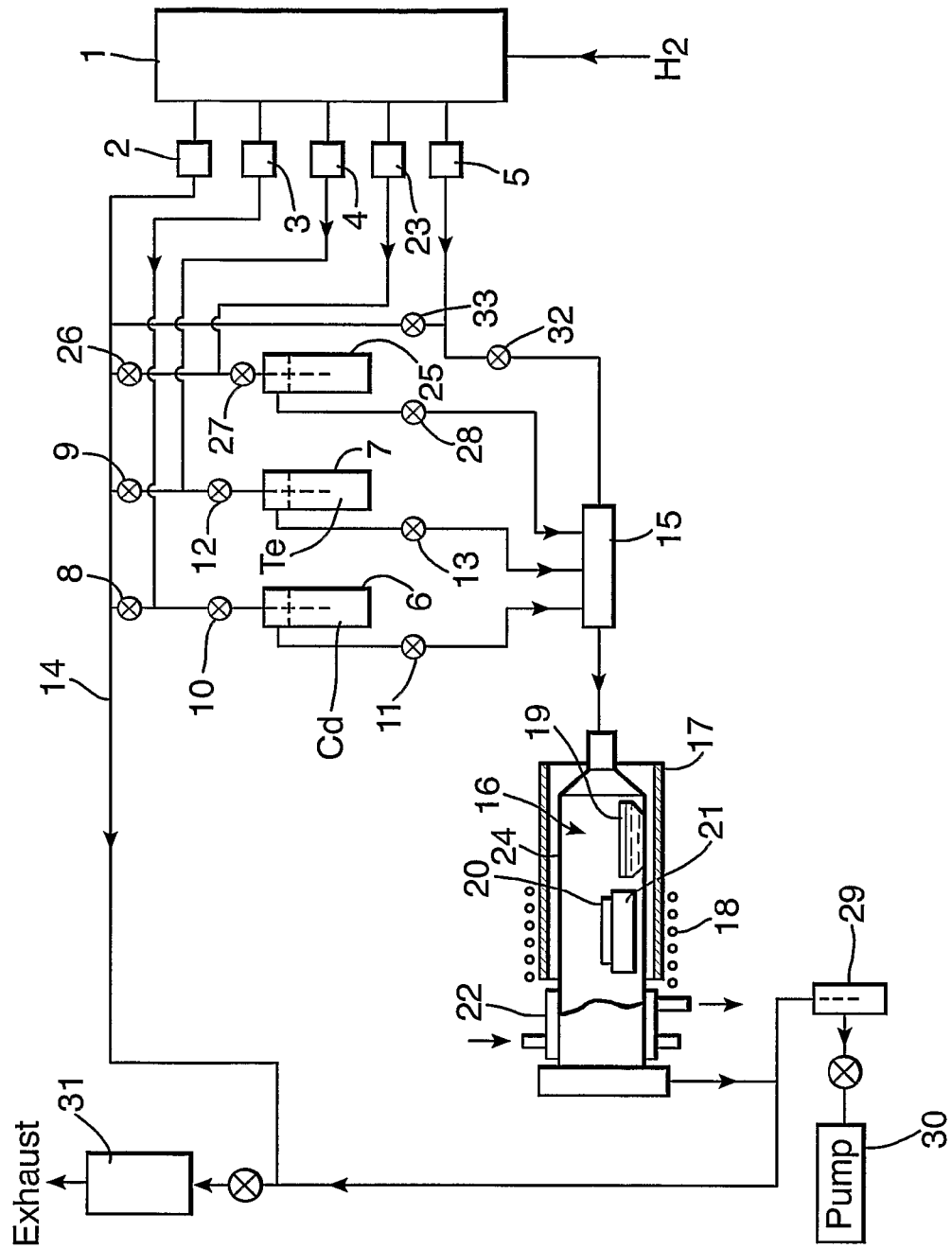
FIG. 6 shows a schematic of an MOVPE apparatus suitable for growth of the CMT layers.

FIG. 6 illustrates the principles of MOVPE growth and shows an apparatus suitable for MOVPE growth although the actual apparatus used may vary. As described more fully in U.S. Pat. No. 4,566,918 a supply of hydrogen is supplied via mass flow controllers 3, 4 and 23 from manifold 1 to bubblers 6, 7 and 25. With valve 8 closed and valves 10 and 11 open gas flows through bubbler 6 whereas with valves 10 and 11 closed and valve 8 open the hydrogen flow from mass flow controller 3 is directed via bypass line 14 to a scrubber or filter 31. Similarly bubbler 7 can be controlled by valves 9, 12 and 13 and bubbler 25 controlled by valves 26, 27 and 28. Only three bubblers are shown in FIG. 3 for simplicity although more bubblers may be needed in practice. Thus the flow through each bubbler can be controlled. The flow from bubblers 6, 7 and 25 may be mixed in mixer 15 where it may be diluted with gas flow from controller 5 (controlled by valves 32, 33) before entering reactor vessel 16 although in other arrangements it may be preferred to supply the precursors separately to the reactor vessel and mix them in the reactor.

The substrate 20, which carries crystalline buffer layers in the growth windows, is located in the reactor vessel 16 on susceptor 21. A bath of elemental mercury 19 is heated by heating element 17 via reactor wall 24 or any suitable heating means, such as internal cartridge heaters located under the mercury bath, and maintains a partial pressure of mercury vapour. The substrate is heated by induction heater 18 or heated by any other suitable means so that the metal-organic precursors in the gas streams from the bubblers 6, 7 and 25 decompose in the vicinity of the substrate.

Bubbler 6 contains a precursor of cadmium such as dimethylcadmium and bubbler 7 contains a precursor of tellurium such as di-iso-propyltelluride. The gas flow from bubblers 6 and 7 to the reactor chamber is controlled sequentially by appropriate control of the valves to grow thin layers of mercury telluride and cadmium telluride in each growth window, the thickness of the layers being controlled to control the overall cadmium content of the final CMT layer which is formed by interdiffusion of the layers in a growth window during the growth process.

To produce the first CMT layer in each growth window, which may for example be a p+CMT layer a p-type dopant should be introduced. A suitable p-type dopant is arsenic although other dopants could be considered such as phosphorus and antimony. Therefore the dopant bubbler 25 contains a suitable precursor such as tris(dimethyl)aminoarsenic (other volatile arsenic components could be used) and the bubbler temperature and gas flow through this bubbler is controlled to give the appropriate doping. After the first CMT layer has been grown the other CMT layers can be grown in sequence. A suitable n-type dopant for any n-type layers is iodine with say iso-butyliodide as the precursor although other precursors could be used and indeed other dopants such as indium could be used. As mentioned where different dopants are used the MOVPE apparatus would have a plurality of dopant bubblers which could be separately controlled rather than the single dopant bubbler shown in FIG. 6. Similarly if any MOVPE buffer layers are to be grown the apparatus may contain bubblers holding precursors for the buffer layer constituents.

Following growth of the CMT layers by MOVPE it is preferable to anneal the material in a mercury rich environment—this fills the mercury vacancies and ensures the desired electrical properties. The annealing may be carried out in a MOVPE reactor and may be performed directly after growth of the CMT layers or it may be performed later using any suitable apparatus.

The invention claimed is:

1. A method of fabricating an infrared device comprising the steps of:
    taking a silicon substrate having an integrated circuit formed thereon,
    selectively growing at least one crystalline buffer layer in at least one growth window by molecular beam epitaxy, and
    selectively growing at least one crystalline CMT layer on said buffer layer by metal-organic vapour phase epitaxy
    wherein the silicon substrate has an orientation of (001) misaligned between 2° and 10° toward <111>, and
    wherein the growth of the at least one buffer layer by molecular beam epitaxy follows the (001) orientation of the substrate, and
    wherein the growth of the at least one CMT layer by metal-organic vapour phase epitaxy also follows the orientation of the substrate so as to form CMT having an (001) crystal orientation.

2. A method as claimed in claim 1 wherein the method comprises the step of forming an integrated circuit on a silicon substrate.

3. A method as claimed in claim 1 wherein the substrate has a plurality of growth windows.

4. A method as claimed in claim 1 wherein the substrate within the or each growth window is at different level with respect to the integrated circuit architecture.

5. A method as claimed in claim 4 wherein the substrate within the or each growth window is lower than the integrated circuit architecture.

6. A method as claimed in claim 4 wherein the substrate within the or each growth window extends higher than the integrated circuit architecture.

7. A method as claimed in claim 1 wherein the substrate within the or each growth window is at the same level as the integrated circuit architecture.

8. A method as claimed in claim 1 wherein the or each growth window is defined by a mask material applied outside of the or each growth window.

9. A method as claimed in claim 1 wherein the method comprises the step of applying a mask material to the substrate outside of the or each growth window.

10. A method as claimed in claim 8 wherein the mask material is titanium tungsten.

11. A method as claimed in claim 1 further comprising the step, prior to growth of the buffer layer, of cleaning the substrate in the or each growth window.

12. A method as claimed in claim 11 wherein the cleaning step includes one or more of solvent cleaning, barrel ashing, ion beam milling and etching with a hydrofluoric acid based etch.

13. A method as claimed in claim 11 wherein the substrate preparation step includes a thermal clean under an arsenic flux performed with a maximum temperature which is not substantially greater than 500° C.

14. A method as claimed in claim 1 wherein at least one buffer layer is chosen from one of cadmium telluride, zinc telluride and cadmium zinc telluride.

15. A method as claimed in claim 1 wherein the step of growing at least one buffer layer comprises growing a first buffer layer of zinc telluride on the substrate and growing a second buffer layer of cadmium telluride on the first buffer layer.

16. A method as claimed in claim 1 comprising the step, prior to growing at least one layer of cadmium mercury telluride, of growing at least one buffer layer by metal-organic vapour phase epitaxy on the at least one buffer layer grown by molecular beam epitaxy.

17. A method as claimed in claim 1 wherein the step of growing at least one cadmium mercury telluride layer comprises an interdiffussion multi-layer process.

18. A method as claimed in claim 1 wherein at least one layer of cadmium mercury telluride is grown as a doped layer.

19. A method as claimed in claim 1 wherein the step of growing at least one buffer layer comprises growing crystalline material in a growth window and poly-crystalline material elsewhere.

20. A method as claimed in claim 1 wherein the step of growing at least one cadmium mercury telluride layer comprises growing crystalline material in a growth window and poly-crystalline material elsewhere.

21. A method as claimed in claim 1 wherein the method includes the step, after the growth of the at least one cadmium mercury telluride layer, of removing any unwanted cadmium mercury telluride and/or buffer layer material.

22. A method as claimed in claim 1 wherein the method further comprises a device processing step to define the shape of the at least one cadmium mercury telluride layer.

23. A method as claimed in claim 9 further comprising the step, after growth of the at least one cadmium mercury telluride layer, of removing any unwanted mask material.

24. A method as claimed in claim 9 further comprising the step of making an electrical connection between the integrated circuit and the at least one layer of cadmium mercury telluride in the or each growth window.

25. A method as claimed in claim 1 wherein the silicon substrate has an orientation of (001) misaligned between 4° and 8° towards <111>.

* * * * *